(12) United States Patent
Warner et al.

(10) Patent No.: US 6,664,020 B1
(45) Date of Patent: Dec. 16, 2003

(54) TRANSFER IMAGING ELEMENTS

(75) Inventors: David Warner, Oakdale, MN (US); Ranjan Chhaganbhai Patel, Essex (GB)

(73) Assignee: 3M Innovative Properties Company, St. Paul, MN (US)

( * ) Notice: Subject to any disclaimer, the term of this patent is extended or adjusted under 35 U.S.C. 154(b) by 2152 days.

(21) Appl. No.: 08/489,822

(22) Filed: Jun. 13, 1995

Related U.S. Application Data

(63) Continuation of application No. 08/361,177, filed on Dec. 21, 1994, now abandoned, which is a continuation of application No. 08/160,955, filed on Dec. 2, 1993, now abandoned.

(30) Foreign Application Priority Data

Dec. 9, 1992 (GB) .............................................. 9225724

(51) Int. Cl.⁷ ................................................. G03C 3/00
(52) U.S. Cl. ...................... 430/253; 430/252; 430/254; 430/255; 430/627; 430/631; 430/635; 430/636; 430/200; 430/201
(58) Field of Search ................................. 430/253, 252, 430/254, 255, 627, 631, 635, 636, 200, 201

(56) References Cited

U.S. PATENT DOCUMENTS

| | | | |
|---|---|---|---|
| 4,489,154 A | 12/1984 | Taylor, Jr. ................... | 430/253 |
| 4,504,567 A | 3/1985 | Yamamoto ................. | 430/165 |
| 4,755,432 A | 7/1988 | Asano et al. ................ | 428/421 |
| 4,766,053 A | 8/1988 | Shinozaki et al. .......... | 430/256 |
| 4,822,713 A | 4/1989 | Nishioka et al. ............ | 430/175 |
| 5,034,371 A | 7/1991 | Tanaka et al. .............. | 503/227 |
| 5,164,265 A * | 11/1992 | Stubbs ........................ | 428/421 |
| 5,232,817 A * | 8/1993 | Kawakami et al. ......... | 430/201 |
| 5,236,886 A * | 8/1993 | Tsuchiya et al. ............ | 430/201 |
| 5,238,726 A | 8/1993 | Ide et al. .................... | 428/195 |
| 5,246,909 A * | 9/1993 | Thien et al. ................. | 430/201 |
| 5,256,506 A | 10/1993 | Ellis et al. ..................... | 430/20 |
| 5,278,023 A * | 1/1994 | Bills et al. ................... | 430/201 |
| 5,283,225 A * | 2/1994 | Neumann ................... | 430/201 |

FOREIGN PATENT DOCUMENTS

| | | |
|---|---|---|
| EP | 0 227 092 A3 | 12/1986 |
| EP | 0 239 082 A2 | 3/1987 |
| EP | 0 373 532 A3 | 12/1989 |
| EP | 0 385 466 A2 | 3/1990 |
| EP | 0 412 495 A2 | 8/1990 |
| JP | 60-234888 A | 11/1985 |
| JP | 61-286196 | 12/1986 |
| JP | 61-286196 A | 12/1986 |
| JP | 64-1589 A | 1/1989 |
| WO | WO 88/04237 | 6/1988 |
| WO | WO 90/12342 | 10/1990 |
| WO | WO 91/00809 | 1/1991 |

* cited by examiner

*Primary Examiner*—Geraldine Letscher
(74) *Attorney, Agent, or Firm*—Eric D. Levinson

(57) ABSTRACT

A mass transfer imaging element comprising a substrate having a surface colourant layer containing a pigment to be imagewise transferred, wherein said colourant layer comprises a fluorocarbon additive in an amount to provide a fluorocarbon additive:pigment weight ratio of at least 1:20.

11 Claims, No Drawings

TRANSFER IMAGING ELEMENTS

This is a continuation of application Ser. No. 08/361,177 filed Dec. 21, 1994, now abandoned, which is a continuation of application Ser. No. 08/160,955 filed Dec. 2, 1993 abandoned.

FIELD OF THE INVENTION

This invention relates to imaging elements and in particular to imaging elements which involve the transfer of colourant from a substrate.

BACKGROUND TO THE INVENTION

There is a continuing need for imaging materials that are dry-processed, i.e., which do not need aqueous or other chemical treatments in order to develop or fix the image. There is a particular need in the area of colour reproduction, e.g., colour proofing, where the demands in terms of resolution are extremely high. Peel-apart and thermal transfer are attractive technologies for this purpose, but poor resolution has hitherto been a problem.

Peel-apart imaging is well-known in the art, and is described, for example, in "Imaging Systems" (Jacobson & Jacobson, Focal Press, 1976, p.213), and in patent literature. Suitable materials generally comprise a photosensitive colourant layer sandwiched between a substrate and a stripping sheet or layer. Light exposure through a suitable mask, followed by careful removal of the stripping sheet, causes an imagewise partitioning of the colourant layer between the substrate and stripping sheet. Both positive- and negative-acting systems are known, i.e., the colourant may be selectively removed from or retained by the substrate in exposed areas.

Because the resulting image consists solely of areas of maximum density and areas of zero density, such systems are ideally suited to half tone reproduction. Full colour images may be provided by generating separate (y,m,c,k) images on transparent substrates and assembling them in register (overlay), as described, for example in U.S. Pat. No. 4,282,308, U.S. Pat. No. 4,286,043 and EP385466, and exemplified by the Du Pont "Cromacheck" system. There is increasing interest in applying peel-apart technology to the formation of integral proofs, in which successive y,m,c,k images are assembled on a common substrate, as described in U.S. Pat. No. 4,489,153 and EP 385466, and British Patent Application No. 92 25687.4

Typically, the colourant layers described in the prior art comprise one or more pigments dispersed in a photocurable medium comprising suitable monomer(s), photo initiator(s) and binder(s). Other layers may be present, such as adhesive layers, release layers, etc, but the prime cause of the image differential is photopplymerisation.

It is known to add surfactants, including fluorinated surfactants, to the photocurable colourant layers described above. Fluorinated surfactants are frequently used as coating aids in the imaging industry generally, e.g., to promote even wetting of substrates, enhance coating uniformity and prevent striations, as described, for example, in U.S. Pat. No. 4,504,567, EP 230995, EP 239082, JP 61-292137 and JP 62-036657, and peel-apart imaging elements are no exception. Generally, the quantities. of surfactant involved are small. For example, EP385466 (table.2, p.16) shows the use of fluorosurfactant in peel-apart colourant layers to the extent of 0.068wt % of the total solids. Of the formulations disclosed, the cyan layer has the lowest pigment content, and this still represents a pigment: surfactant ratio of about 70:1.

Likewise EP373532 discloses the use of fluorosurfactants in the photocurable colourant layers of peel-apart imaging elements, but does not give details of preferred quantities and does not mention any effects on the speed or resolution of the media. The Examples disclose pigment:surfactant ratios ranging from 57.8:1 to 20.9:1.

Thermal transfer imaging is also well known in the art. Two types of donor media may be distinguished, namely sublimation (or diffusion) transfer media, and mass transfer media. In the former, dyes are caused to migrate from a donor to a receptor in amounts proportional to the energy applied, giving continuous tone images, while in the latter, zero or 100% transfer of the colourant layer takes place according to whether the applied energy exceeds a given level. The latter type is highly suited to half tone reproduction since the resulting images consist of areas of zero or maximum optical density.

Two modes of address may also be distinguished for thermal transfer imaging, namely print head and IR address. In the former, heat is supplied to the donor-receptor assembly via an external print head comprising an array of microresistors, while in the latter the energy is supplied by a radiant source (usually an IR emitter such as a laser) and converted to heat within the donor-receptor assembly by a suitably-placed radiation absorber. Print heads have inherent limitations with respect to resolution (e.g., 400 dpi max.), so that the resolution of the media is less of a problem. Laser scanners can readily achieve >2000 dpi resolution, and so the capabilities of the media become critical. Print head addressable mass transfer media generally comprise a substrate bearing a colourant layer of a waxy resin containing dispersed dyes or pigments, a typical commercially-available example being TLP OHPll, available from Mitsubishi.

IR addressable thermal mass transfer media are well known in the literature see, for example, JP 63-319192, WO 90/12342 and WO 92/06410 and additionally comprise a suitable IR absorbing dye or pigment either within the colourant layer or in a separate layer underneath the colourant layer. It is also possible for the IR absorber to be located in the receptor, as described in our copending PCT Application No. GB 92/01489.

Fluorinated surfactants have also found utility as coating aids in the preparation of transfer media. In addition, such surfactants have been used for other purposes.

U.S. Pat. No. 5,034,371 describes a dye-diffusion transfer donor for printhead address comprising a fluorocarbon additive in addition to dye(s) and binder. The relevant Example teaches about 5 wt % fluorocarbon (FC). Improvements are shown in terms of non-sticking to the receptor and lack of creasing.

JP 61-206694 discloses a mass-transfer donor for printhead address comprising a pigmented layer overcoated with a layer of surfactant, preferably fluorosurfactant. The purpose is to achieve better transfer to poor quality paper.

WO 88/04237 discloses a thermal imaging medium which is laser-addressable, comprising a support sheet having a surface of a material which may be temporarily liquified by heat and upon which is deposited a particulate or porous layer of an image forming substance which is wettable by the material in its liquefied state. Either the image forming substance is itself IR-absorbing, or a separate absorber is present. In exposed areas, the liquefiable material melts, wets the particles of the image forming substance, then resolidifies, thus anchoring the particles to the substrate. Removal of a stripping sheet (either present from the outset or applied subsequent to exposure) then causes selective removal of the particles in the non-exposed areas. The image forming layer may comprise pigment particles with or without binder, but when binder is used the pigment:binder ratio is high—in the range 40:1 to 1:2, preferably 5:1. Surfactants, including fluorosurfactants, may be added, and the examples show the use of Fluorad FC-120 at the level of 2.7 wt % of total solids, which corresponds to a pigment:FC ratio of about 30:1. The stated purpose is to improve coating quality, with no mention of resolution enhancement. This patent application also teaches the addition of submicroscopic particles to the image forming layer in order to improve the abrasion resistance of the final image. Polytetrafluoroethylene is said to be particularly useful, but this embodiment is not demonstrated in the Examples.

It has now been found that the inclusion of relatively large amounts of fluorocarbon compounds in the colourant layer of a mass transfer sheet leads to improved properties, particularly improved resolution.

BRIEF SUMMARY OF THE INVENTION

Therefore according to the present invention there is provided a mass transfer imaging element comprising a substrate bearing a colourant layer containing a pigment which is adapted to be imagewise transferred, in which the colourant layer comprises a fluorocarbon additive in an amount to provide a fluorocarbon additive:pigment weight ratio of at least 1:20.

DESCRIPTION OF PREFERRED EMBODIMENTS

In accordance with the invention, in both peel-apart and thermal transfer systems, a marked improvement in resolution is seen when the colourant layer additionally contains a fluorocarbon (FC) additive in an amount corresponding to a FC:pigment ratio of at least 1:20, preferably 1:15, more preferably at least 1:10, by weight. In the case of thermal transfer donors, there is also an unexpected improvement in sensitivity. It is believed that the fluorocarbon serves to reduce the cohesive forces within the layer and hence promotes clean "shearing" of the layer in the direction perpendicular to its major surface. A further advantage shown by IR-addressed thermal transfer donors of the invention is an improved integrity of transferred dot. During IR address (e.g. by a laser), very high temperatures may be generated within the colourant layer, sufficient to degrade and partially or completely volatilise binder components of the colourant layer. The gas generated as a result may help to propel the pigment particles towards the receptor, and indeed certain prior art patents, e.g., WO 90/12342 and WO 92/06410 advocate the use of thermally-labile, gas-producing compounds to enhance this effect, and so increase the sensitivity. However, a side effect of this is a tendency for the pigment particles to "scatter", producing a less well-defined dot on the receptor. The thermal transfer donors of the present invention do not suffer from this defect, and it is believed that the addition of substantial amounts of thermally-inert fluorocarbon derivatives promotes transfer of the colourant in a molten rather than a vaporised state. Surprisingly, this does not incur a loss of sensitivity; indeed the donor elements of the invention show higher sensitivities than those described in the prior art.

Although fluorocarbons have been incorporated previously in both peel-apart and thermal transfer media, as described above either the quantities involved have been significantly lower than those used in the present invention, or the constructions involved have been of a different type. The improved properties of resolution and sensitivity have no precedent in the prior art. The improvement is significant; U.S. Pat. No. 5,019,549 discloses laser transfer donors similar to the preferred donors of the present invention, but lacking any FC additive. Sensitivities of 0.38 and 0.75 $Jcm^{-2}$. are quoted, which compares unfavourably with the present invention, which can achieve sensitivities of 0.075 $Jcm^{-2}$.

The substrate may be any of the materials commonly used in peel-apart and thermal transfer media, but for reasons of cost, availability, optical clarity, thermal and dimensional stability, polyester is the material of choice. For peel-apart and laser-addressed media the substrate must be transparent. The preferred thickness is different for the different embodiments. Printhead addressed materials require a very thin substrate ($<10\mu$), while with peel-apart media there is a trade-off between resolution and handleability. Thinner substrates improve resolution, but at the expense of an increased tendency to crease and wrinkle. A thickness in the range 10–25 microns represents a good compromise, although other ranges may be used. For laser-addressed media, substrate thickness is less critical, and a wide range may be used, e.g., 20 to $200\mu$ typically about $100\mu$.

In principle, any pigment (organic or inorganic) may be used, providing it has the desired colour and suitable light-fastness and thermal stability for the purpose intended. Particularly suitable pigments are those currently supplied to the colour proofing industry, as they are available in shades which allow matching of internationally-agreed standards for colour reproduction. Examples of such pigments include 249–0592, 248–0615, 234–0071, 275–0570 (all available from Sun Chemical Co), RV-6853 (Mobay), 1270 (Harshaw) and Raven-760. Other examples are listed in EP 385466 and in the following Examples. The choice of pigment is not limited to those producing the "conventional" colours (yellow, magenta, cyan and black), but extends to other colours, and pigments for special purposes, such as reflective pigments, UV-absorbing pigments, fluorescent pigments and magnetic pigments.

Generally speaking, the smaller the pigment particle size, the better the resolution achievable, but this may be counteracted by other factors such as the quality of the dispersion. A distribution of particle sizes will normally be present, but preferably no particles or agglomerates of particles should be so large as to affect resolution on the micron scale. The quantity of pigment will vary with factors such as layer thickness, the optical density desired, and the optical properties of the pigment itself, but typical values are in the 10–70% by weight of the total involatiles of the colourant layer. For peel-apart elements, the preferred pigment loading is in the range 15 to 30 wt % and for thermal transfer donors it is in the range 35 to 65 wt %.

The colourant layer normally comprises a binder which may be chosen from a wide variety of homopolymers, copolymers and blends of polymers. The main criteria are film-forming ability, optical clarity, solubility in the commonly-used coating solvents (acetone, methyl ethyl ketone (MEK), etc. and compatibility with the pigment. Examples include vinyl polymers such as polyvinylbutyral and polymers and copolymers of vinyl chloride, vinyl acetate, vinyl ethers etc., acrylic polymers such as poly(alkyl acrylates) and poly(alkyl methacrylates), cellulose esters, polyesters, polyamides, polycarbonates, and phenolic resins. Preferred materials include VAGH (a copolymer of vinyl chloride and vinyl acetate (partially hydrolysed) available from Union Carbide) and Resinox 7280 (a phenolic resin available from Monsanto), preferably modified by reaction of a proportion of the phenol groups with a di-isocyanate.

The fluorocarbon additive is present in sufficient quantity to give a FC:pigment ratio of at least 1:20, preferably 1:15 and more preferably at least 1:10. The upper limit depends to a large extent on the structure of the fluorocarbon, the properties of the other ingredients and the end use, but is seldom greater than 1:1. Typical values for photocuring peel-apart media are in the range 1:2 to 1:5. Too little fluorocarbon leads to loss of resolution and/or sensitivity while too much may lead to poor quality coatings lacking structural integrity.

In the case of thermal transfer media, a further factor to be considered is that of overprintability. In order to generate full colour images, it is necessary to transfer several separate monochrome images to a common receptor, and very high levels of fluorocarbon in the transferred colourant can make this difficult. Yet another factor to be considered is the mode of address of the thermal transfer media. As described previously, one function of the fluorocarbon is to help maintain dot integrity during the transfer process, and the amount required to achieve this may vary depending on the conditions under which transfer takes place. For example, address by a relatively high-power laser such as a YAG laser may require higher loadings of the fluorocarbon than when address is by a lower power device such as a laser diode. For these reasons, the preferred loading of fluorocarbon in media designed for thermal transfer imaging extends over a greater range, eg to give FC:pigment ratios in the range 1:3 to 1:15.

A wide variety of fluorocarbon compounds may be used, provided they are substantially involatile under normal coating and drying conditions, and sufficiently miscible with the binder material(s). Thus, highly insoluble fluorocarbon resins such as PTFE, polyvinylidenefluoride, are unsuitable, as are gases and low boiling liquids, such as perfluoroalkanes. With the above exceptions, both polymeric and lower molecular weight materials may be used, although the latter are preferred. Preferably the fluorochemical is selected from compounds comprising a fluoroaliphatic group attached to a polar group or moiety and fluoropolymers having a molecular weight of at least 750 and comprising a non-fluorinated polymeric backbone having a plurality of pendant fluoroaliphatic groups, which aliphatic groups comprise the higher of (a) a minimum of three C—F bonds, or (b) in which 25% of the C—H bonds have been replaced by C—F bonds such that the fluorochemical comprises at least 15% by weight of fluorine.

The fluoroaliphatic group is generally a fluorinated, preferably saturated, monovalent, aliphatic group of at least two carbon atoms. The chain may be straight, branched, or, if sufficiently large, cyclic, and may be interrupted by oxygen atoms or nitrogen atoms bonded only to carbon atoms. A fully fluorinated group is preferred, but hydrogen or chlorine atoms may be present as substituents in the fluorinated aliphatic group; generally not more than one atom of either is present in the group for every two carbon atoms. Preferably the group contains a terminal perfluoromethyl group. Preferably, the fluorinated aliphatic group contains no more than 20 carbon atoms.

Non-polymeric fluorochemical additives generally comprise lower molecular weight fluorinated compounds and contain at least 15% (preferably 20%) by weight of fluorine, and are substantially involatile under atmospheric pressure at temperatures up to 50° C., preferably up to 100° C., most preferably up to 150° C. Such materials commonly comprise a fluorinated aliphatic group attached to a polar group or moiety such as carboxylic acid (and salts thereof), phosphoric acid (and salts thereof), sulphonic acid (and salts thereof), acid halide, sulphonyl halide, ether, ester, amide, sulphonamide, polyether, urethane, carbonate, urea, carbamate etc.

Suitable polymeric fluorochemical additives include a wide range of polymeric and oligomeric materials generally having a molecular weight of at least 750, preferably at least 1000, which materials comprise a polymeric or oligomeric backbone having a plurality of pendant fluoroaliphatic groups. The polymeric backbone may comprise any suitable homopolymer or co-polymer known to the art including, for example, acrylates, urethanes, polyesters and polycarbodiimides. Co-polymers of fluorinated and non-fluorinated monomers are also useful. Generally the fluoropolymer has a minimum fluorine content of 15%, and preferably 20% by weight.

Generally where the backbone comprises hetero-atoms (e.g., oxygen, nitrogen, sulphur etc.) in addition to carbon atoms, then fluorine may be present as a backbone substituent. Where the backbone comprises solely carbon atoms, then the fluorine substituents are usually confined to the pendant fluoroaliphatic groups, the backbone remaining fluorine free. Thus, fluorinated polyethers, polyesters, polyurethanes or other polymers formed by ring opening or condensation polymerisation are included, but the highly insoluble polymers and copolymers of tetrafluoroethylene, hexafluoropropylene, chlorotrifluoroethylene, vinyl fluoride, vainylidene fluoride etc. are excluded.

The fluoropolymer preferably comprises an acrylate homopolymer or co-polymer backbone supporting a number of fluoroaliphatic groups. The term acrylate is used in the genericasense and is intended to include not only derivatives of acrylic acid but also methacrylic acid and other modified acrylic acids.

Each acrylate monomer may possess one or more fluoroaliphatic groups in which the higher of (a) a minimum of three C—F bonds are present or (b) 25% of the C—H bonds have been replaced by C—F bonds. Each acrylate monomer incorporates at least one polymerisable vinyl group.

Suitable fluorochemicals are disclosed on page 3 lines 18 to 39 of EP 0433031. Compounds A-1 to A45 and B1 to B3 listed in U.S. Pat. No. 5,034,371 cols 38 to 40 are also useful. Other suitable fluorocarbons are disclosed in U.S. Pat. Nos. 2,567,011, 2,732,398, 2,803,615, 2,803,656, 3,078,245, 3,544,537, 3,574,791, 3,787,351, 4,015,612 4,049,861, 4,167,617 and 4340749. Fluorocarbons bearing polymerisable unsaturated groups are particularly suitable for the peel-apart systems because they can participate in the photocuring reaction.

In addition to the above ingredients, peel-apart elements of the invention comprise a photocuring system, which normally consists of one or more polymerisable monomers, a photoinitiator and optionally a sensitiser. Any of the commonly-used unsaturated monomers may be used, but preferably at least a proportion of the monomers are at least bifunctional, so that a crosslinked network is produced on curing. Suitable monomers are disclosed for example, in EP 0385466A. Preferred monomers include trimethylolpropane trimethacrylate, ethyleneglycol dimethacrylate, tetraethyleneglycol dimethacrylate and tripropyleneglycol dimethacrylate. The monomers typically constitute 30 to 50 wt % of the involatiles in the colourant layer, but this may vary depending on the nature of the other ingredients.

A wide variety of photoinitiators may be used, including those disclosed on pages5 to 6 of EP 385466. Preferred initiators include trichloromethyltriazine derivatives and onium salts such as iodonium and sulphonium salts. If necessary, a sensitiser may be included. For colour proofing purposes, it is highly desirable that the initiator and sensitiser should not absorb significantly in the visible range of the spectrum to avoid contaminating the final coloured image. Thus, initiator systems sensitive to the UV are most commonly used, although sensitisation to the IR is also possible, e.g., using the initiator-sensitiser combinations disclosed in EP 444786.

In addition to the basic ingredients of binder, pigment and fluorocarbon, the colourant layer of thermal transfer donors in accordance with the invention may include other ingredients such as plasticisers and IR absorbers. A plasticiser may be added to lower the softening temperature of the final coating, and normally comprises a high-boiling liquid or low-melting solid. The polyfunctional monomers listed above have proved useful in the context, e.g., at a loading of 25% of the total solids, but with a suitable choice and quantity of fluorocarbon, addition of plasticiser is unnecessary. If the thermal transfer donor is to be imaged by IR radiation, then a suitable absorber may be incorporated in the colourant layer, or in an underlayer. Alternatively, the absorber may be present in a layer coated on the receptor to which the image is to be transferred, as described in our copending PCT Application No. GB 92/01489. Essentially any dye or pigment providing a suitable IR absorption may be used, including those disclosed in Japanese Patent Applications Nos. 51-88016 and 63-319192. A layer of vapour-deposited metal or metal oxide, as described in WO 92/06410, may be used. Dyes or pigments which have minimal absorption in the visible region, or which bleach during imaging, are preferred, particularly if they are to be incorporated in the colourant layer itself. IR dyes with minimal visible absorption include the croconium dyes described in British Patent Application No. 9209047.1, the phthalocyanines described in EP 157568, and the aromatic diamine dication-type dyes described on pages 6 to 8 of WO 90/12342, of which Cyasorb IR 165 (American Cyanamid) is a good example. Dyes that require long alkyl chain substituents for solubility may interact unfavourably with the fluorocarbon additive, and are not preferred.

The solutions used to coat the colourant layers may be conveniently prepared by roll-milling the pigment and binder in accordance with known techniques to give "pigment chips", adding solvent (acetone, MEK etc) to produce "millbase", then adding the remaining ingredients and further solvent as required. Different pigment chips can be mixed in order to obtain the desired L* a* b* values for SWOP colour matching.

Alternatively, two pigment chip millbases can be mixed in the desired ratio to obtain the desired L* a* b* values. It is highly preferred to add the fluorocarbon to a predispersion of the pigment and binder, otherwise much of its beneficial effect may be lost.

The layers may be coated by any of the conventional means, along with whichever other layers are required by the particular construction.

The invention is applicable to peel-apart constructions known in the art and is particularly useful in the colour sheets for full colour proofing disclosed in our British Patent Application of even date. That application discloses a colour sheet suitable for use in colour proofing comprising a substrate bearing a layer of pigmented photopdlymerisable material overcoated with a barrier layer and an outer layer of an adhesive.

The application also discloses a method of preparing a full colour proof which comprises laminating a colour sheet as defined above to a support base, exposing the sheet through its substrate, peeling the substrate from the sheet to remove unexposed regions of the pigmented photopolymerisable material, repeating the lamination, exposure and peeling steps with three additional colour sheets to build up a full colour proof comprising cyan, magenta, yellow and black layers.

The advantages of the system over prior art are that whilst it allows for the least polyester waste and a simple customer assembly in a minimum number of steps, the barrier layer which is normally poly(vinyl alcohol) also allows for solvent coating of adhesives during manufacture. Prior art methods for construction of a surprint negative acting dry-developed proof either involve more plastic support wastage or an additional number of steps (which lowers customer productivity) or both.

Imaging of the thermal mass transfer donor elements of the invention is carried out by assembling the donor in intimate contact with a suitable receptor (usually under pressure) and supplying an imagewise pattern of thermal energy via a printhead or IR radiation as appropriate, such that areas of colourant layer are transferred to the receptor in accordance with the image information. Peeling of the donor from the receptor reveals matched positive and negative images on the donor and receptor respectively. The process may be repeated using donors of different colours (or a single donor coated with patches of different colours, as described in U.S. Pat. No. 4,503,095, may be used), so that a multi-colour image is built up on the receptor. If desired, this can be re-transferred to another substrate, e.g., plain paper. Alternatively, the positive images remaining on the donor sheets may be assembled into a final image, e.g., by overlaying in register or transfer in register to a common substrate.

Any of the known methods of IR address may be used, including direct address by a laser pulsed in accordance with digitised image information; flood exposure through a suitable mask from a source such as a xenon arc, tungsten bulb etc, as described in Research Disclosure No. 142223; and exposure through a mask by a scanned continuous source, as described in UK Patent Application No. 9217095.0. Preferred lasers for use with the invention include diode lasers (e.g. GaAs lasers), Nd-YAG lasers and Nd-YLF lasers.

The invention will now be illustrated by the following Examples.

In the Examples the following abbreviations are used to identify the fluorochemicals.

F1 N-butylperfluorooctanesulphonamido ethyl acrylate.

F2 a fluorochemical acrylate oligomer disclosed in U.S. Pat. No. 3,787,351, Example 1.

F3 perfludrooctanoic acid.

F4 perfluorooctanesulphonamido ethyl alcohol.

F5 1,1-dihydro-2,5-bis(trifluoromethyl) 3, 6, dioxaperfluorodecyl methacrylate.

F6 N-methyl perfluorooctanesulphonamide

F7 N-methyl, N-glycidyl perfluorooctanesulphonamide.

F8 N-Ethyl, N-vinyloxyethyl perfluorooctanesulphonamide.

F9 Methylene bis(trifluoromethylsulphone).

F10 N-Ethyl, N-omega-methoxy poly(methyleneoxy) ethyl perfluorooctanesulphonamide.

EXAMPLE 1

The following millbases were prepared:

| Cyan Millbase | |
|---|---|
| modified Resinox | 31 g |
| Butvar B76 | 0.87 g |
| Cyan Pigment | 8.24 g |
| Methyl ethyl ketone | 59 g |
| Magenta Millbase | |
| Modified Resinox | 31 g |
| Magenta Pigment | 4.04 g |
| Black Pigment RMF-0536 | 0.0186 g |
| Methyl ethyl ketone | 60 g |
| Yellow Millbase | |
| Modified Resinox | 31 g |
| Butvar B76 | 0.87 g |
| Yellow Pigment | 5.00 g |
| Methyl ethyl ketone | 60 g |
| Black Millbase | |
| Modified Resinox | 31 g |
| Butvar B76 | 0.87 g |
| Black Pigment | 5.27 g |
| Cyan Pigment | 1.86 g |
| Magenta Pigment | 0.98 g |
| Methyl ethyl ketone | 60 g |

Milling was carried out for in excess of twenty-four hours in a ceramic pot with ceramic balls on a planetary ball mill. Pigments used were:

| | |
|---|---|
| Cyan | Pigment Blue 248-0061 (Sunfast), Pigment Blue 249-1282 (Sunfast) |
| Magenta | Pigment Red RT-698-D (Watchung B), Pigment Magenta RV-6803 (Quindo) |
| Yellow | Pigment Yellow 275-0562 (Transaperm), Pigment Yellow 1270 Benzidene AAOT. |
| Black | Pigment Carbon Black 3ooR (Regal) |

Modified Resinox is a 29.2% (w/w) solution in 2-butanone of reaction product of 92% (w/w) Resinox 7280 (a phenolic resin commercially available from Monsanto) and 8% (w/w) DDI-1410 (a di-isocyanate commercially available from Henkel).

Butvar B76 is poly(vinyl butyral) commercially available from Monsanto.

Peel-apart imaging elements A and B were prepared by coating the following formulations on polyester base at a wet thickness of 24 microns (all parts are by weight):

| A | |
|---|---|
| Cyan millbase | 5.9 parts |
| Trimethylolpropane trimethacrylate | 2.0 parts |
| 4-butoxyphenyl phenyliodonium trifluoroacetate | 0.19 parts |
| 2 -ethylanthracene | 0.0625 parts |
| methyl ethyl ketone | 12.6 parts |
| B - as for A, with the addition of:- | |
| F2 | 0.40 parts |
| (giving a FC:pigment ratio of 1:1.2 | |

An aqueous solution of poly(vinyl alcohol) Mw 72000, degree of hydrolysis 97.5–99.5%) was prepared at 8% w/w concentration. To 10 parts of this was added 3 parts of solution obtained by mixing 40 g of 7.6% w/w aqueous solution of Superamide L9C (Millmaster Onyx) with 6 ml of Teepol HB7 (Shell chemicals), diluting to 200 ml and filtering. The poly(vinyl alcohol) mixture was coated on top of A and B at a wet thickness of 50 microns and dried at 65° C.

The resulting photosensitive elements were given 25 units exposure (from the poly(vinyl alcohol) side) through a half tone mask using a Nu-Arc 40-6K metal halide source. The poly(vinyl alcohol) layers were peeled away with the aid of adhesive tape, the polyester base being held flat. Negative images with respect to the mask were left on the polyester. In the case of element B, there was 100% removal of the unexposed areas, with the microdots well resolved. In the case of Element A, there was incomplete removal of the unexposed areas, and poorer resolution.

In a further experiment separate colour sheets were prepared by coating each of the following colour layer formulations onto 12μ unsubbed polyester at the indicated wet coating thickness and drying for four minutes at 65° C.

| Cyan Colour Layer | |
|---|---|
| Cyan Millbase | 2.5350 g |
| Trimethylolpropane Trimethacrylate | 0.4000 g |
| F1 | 0.0625 g |
| Triazine A | 0.0250 g |
| Butvar B76 | 0.0200 g |
| Wet coating (FC:Pigment Ratio 1:3.3) | 4μ |
| Magenta Colour Layer | |
| Magenta Millbase | 2.5350 g |
| Trimethylolpropane Trimethacrylate | 0.4000 g |
| F1 | 0.0625 g |
| Triazine A | 0.0250 g |
| Cellulose Acetate Butyrate CAB-500-5 | 0.0750 g |
| Methyl ethyl ketone | 0.3500 g |
| Wet coating (FC:Pigment Ratio 1:1.7) | 12μ |
| Yellow Colour Layer | |
| Yellow Millbase | 2.5350 g |
| Trimethylolpropane Trimethacrylate | 0.4000 g |
| F1 | 0.0600 g |
| Triazine A | 0.0250 g |
| Butvar B76 | 0.0250 g |
| Methyl ethyl ketone | 3.0000 g |
| Wet thickness (FC:Pigment Ratio 1:2.2) | 12μ |
| Black Colour Layer | |
| Black Millbase | 2.5350 g |
| Trimethylolpropane Trimethacrylate | 0.4800 g |
| F1 | 0.0625 g |
| Triazine A | 0.0250 g |
| Butvar B76 | 0.0250 g |
| Wet thickness (FC:Pigment Ratio 1:5) | 4μ |

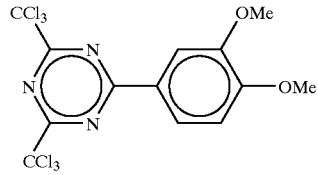

The poly(vinyl alcohol) mixture described above was coated over each of the colour layers at a wet coating thickness of 100μ and dried at 65° C. for eight minutes to form a barrier layer.

Adhesive Layer

Each barrier layer was then overcoated with an adhesive formulation which contained an antihalation, compound.

The adhesive was a copolymer of vinyl pyrrolidone and vinyl acetate and the adhesive formulation was as follows:

| | |
|---|---|
| GAF E-735 50% wt/wt copolymer in ethanol | 12.5 g |
| Ethanol | 12.5 g |

A saturated solution of Compound B was made up in the above adhesive formulation and coated onto the poly(vinyl alcohol) layer at a wet thickness of 24μ and dried at 65° C. for four minutes.

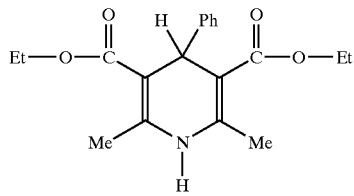

compound B

Colour Proofing

Samples of the colour sheets were laminated separately to Matchprint base via the adhesive layer with a 3M 447 Matchprint laminator, then exposed through an UGRA Plate Control Wedge using a 40-6K NuArc 6KW frame. After peeling away the polyester sheet, negative images with the following dot resolutions (150 lines/inch) were obtained:

| | % dot |
|---|---|
| cyan | 2 to 98 |
| magenta | 5 to 99 |
| yellow | 2 to 97 |
| black | 1 to 98 |

Full colour proofs were made by lamination of a first coloured sheet to Matchprint base, exposure (2.5 NuArc units) and peel-apart; then lamination of the next colour, exposure in register and peeling to give the second colour and so on to give the four colour proof.

EXAMPLE 2

Millbases

Pigment chips were made in accordance with known procedures in a two roll mill, using either three parts pigment to two parts VAGH binder, or one part pigment to one part VAGH binder by weight.

Pigments used were Sun 249-0592 and Sun 248-0615 (cyan), Sun 234-0071 and Mobay RV-6853 (magenta), Harshaw-1270, Sun 275-0570 (yellow) and Raven-760 (black).

VAGH—copolymer of vinyl chloride and vinyl acetate, partially hydrolysed (Union Carbide).

Millbases were made up at 10% weight solids/weight of solution by shaking or stirring the chips in MEK overnight. This resulted therefore in millbases of the 3:2 or 1:1 (pigment:VAGH) types.

Colour Sheets

Colour sheets wereprepared by coating the following formulations on the polyester sheet used in Example 1. The barrier layer and adhesive formulations used were the same as in Example 1, except that the barrier layer formulation comprised 0.5 g, Trisophone PK (5% aqueous solution) in place of the surfactant mixture used previously.

| Cyan Sheet | |
|---|---|
| Trimethylolpropane trimethacrylate (Celanese Chem. Co.) | 0.420 g |
| F1 | 0.064 g |
| Triazine A | 0.026 g |
| Cyan millbase 1:1 | 4.0170 g |
| MEK | 9.054 g |
| FC:Pigment ratio | 1:3.1 |

The formulation was mixed and coated with a Meyer bar 3 (6.5μ wet), dried one minute at 100° C., overcoated with the 8% PVA formulation (Meyer bar 30 to 65μ wet deposit) and dried for four minutes at 100° C., then overcoated with the adhesive formulation using Meyer bar 12 (26μ wet) and dried two minutes at 100° C. A strip was laminated onto Matchprint Commercial Base using a Matchprint 447 Laminator. Exposure through an UGRA Plate Control Wedge on a 5KW Berkey-Ascbr frame. (10 units) followed by peel-apart gave a negative image in which the 2% to 98% dots (150 lines/inch) were resolved.

| Magenta Sheet | |
|---|---|
| Trimethylolpropane trimethacrylate (Celanese Chem. Co.) | 0.397 g |
| Fluorad F1 | 0.071 g |
| Triazine A | 0.035 g |
| Magenta millbase 3:2 | 4.00 g |
| FC:Pigment Ratio 1:3.4 | |

The formulation was mixed and coated with a Meyer bar 4 (8.54μ wet) and dried one minute at 100° C. This was overcoated and tested as for the cyan sheet. An exposure of 20 units gave a negative image showing 3% to 99.5% dots (150 lines/inch) on peel-apart.

| Yellow Sheet | |
|---|---|
| Trimethylolpropane trimethacrylate (Celanese Chem. Co.) | 0.412 g |
| F1 | 0.070 g |
| Triazine A | 0.025 g |
| Yellow millbase 1:1 | 4.019 g |
| FC:Pigment Ratio 1:2.9 | |

The above formulation was coated with a Meyer bar 3 and dried one minute at 100° C. Overcoats were applied as for the cyan sheet. Lamination and exposure were carried out as previously described. Exposure of 15 units (Berkey-Ascor 5KW frame) gave a negative image showing 4% to 97% dots (150 lines/inch) on peel-apart.

A full colour proof was assembled as described in Example 1.

EXAMPLE 3

A dispersion of magenta pigment was prepared by milling magenta pigment chips (3:2 w/w pigment:binder (VAGH) as prepared in Example 2 in sufficient 2-butanone to give a 10% solids dispersion using a McCrone Micronising Mill. Donor Elements 1 to 4 were prepared by adding the ingredients shown below to 5 g aliquots of the pigment dispersion then coating the resulting mixture on subbed polyester (100μ) using K-bar 2. The dried coatings had an optical density (OD) of 3.0 at 560 nm.

| Donor Element | Addition | |
| --- | --- | --- |
| 1 (control) | none | |
| 2 (control) | ATM-11 | (0.25 g) (plasticiser) |
| 3 (invention) | F1 | (0.0625 g) |
| 4 (invention) | F1 | (0.0625 g) + ATM-11 (0.25 g) |

The FC:pigment ratio in elements 3 and 4 is 1:4.8.

An IR-absorbing receptor sheet was prepared by coating a solution of IR Dye I (0.25 g) and VYNS(2.5 g) in 2-butanone (25 g) and toluene (25 g) on paper at a wet thickness of 62.5μ.

ATM-11—trimethylolpropanetriacrylate commercially available from Ancomer Chemicals.

VAGH—copolymer of vinyl chloride and vinyl acetate, partially hydrolysed, commercially available from Union Carbide.

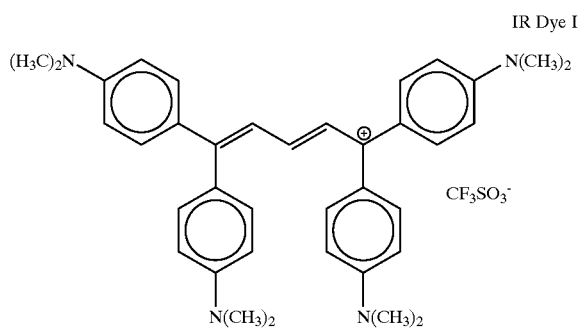

IR Dye I

Samples of the donor elements were assembled face-to-face with samples of the receptor sheet and imaged from the donor side via a pulsed laser diode (model SDL 5421 from Spectra Diode Ltd, delivering 150 mw max at 830 nm) modulated at 100 dots/inch (dpi), using the "rolling lens" apparatus disclosed in British Patent Application No. 9220271.2. The laser power was 100 mW (nominal) at the image plane, and the beam was focused to a 20μ spot. The maximum scan rate consistent with image transfer, the calculated sensitivity, and the quality of the transferred image are listed in the following Table:

| Element | Scan Rate | Sensitivity | Quality |
| --- | --- | --- | --- |
| 1 | 100 cm/sec | 0.5 J/cm$^2$ | Dot tear, no separate lines |
| 2 | 200 " | 0.25 " | Severe dot tear, high Dmin |
| 3 | 200 " | 0.25 " | Clean dot, separate lines |
| 4 | 200 " | 0.25 " | Clean dot, separate lines |

It is readily apparent that the donor elements containing F1 show higher sensitivity and/or resolution.

EXAMPLE 4

Donor Elements 5 to 10 were prepared as for Donor Element 3, but varying the content of F1. Using the receptor of Example 3, test images were transferred using an external drum scanner with vacuum hold-down of the donor-receptor composite. The laser diode delivered 110 mW at the image plane, focused to a 20μ spot. Modulation was 100 dpi and the scan speed 600<m/sec. The results were as follows:

| Element | FC:Pigment(w/w) | Dmin | Image Quality |
| --- | --- | --- | --- |
| 1 | 0 | 0.3 | Partial transfer, dot tear |
| 5 | 1:20 | 0.3 | Partial transfer, dot tear |
| 6 | 1:10 | 0.1 | Partial transfer |
| 7 | 1:6.7 | 0.0 | 100% transfer |
| 8 | 1:5 | 0.0 | 100% transfer |
| 9 | 1:3.75 | 0.0 | 100% transfer |
| 10 | 1:3 | 0.0 | 100% transfer* |

*scan speed 500 cm/sec.

The sensitivity was observed to increase with increasing FC content up to a FC:pigment ratio of 1:3 (Element 10), which required a slightly slower scan speed to achieve 100% transfer in the exposed areas. Resolution also improved with increasing FC content, with clean dots transferred for FC:pigment ratios >1:10. Another beneficial effect of increasing FC content is the reduction of unwanted colourant transfer in non-imaged areas (Dmin), presumably due to the "non-stick" effect.

EXAMPLE 5

This Example demonstrates the use of a variety of FC additives.

Donor Elements 11–18 were prepared in the same way as Element 3, but varying the identity of the FC compound. Test images were transferred to the receptor of Example 3 using the vacuum drum and/or rolling lens test beds. Modulation was 100 dpi, and the laser power and scan speed were varied to find the lowest power/fastest scan consistent with 100% transfer.

| Element | F | Rolling Lens Scan Speed/Laser Power (cm/sec)/(mW) | (Vacuum Drum) Scan Speed/Laser Power (cm/sec)/(mW) |
| --- | --- | --- | --- |
| 11 | F2 | 100/100 | No Image |
| 12 | F3 | 200/100 | 400/100 |
| 13 | F4 | 200/75 | 200/100 |
| 14 | F5 | 200/74 | 200/100 |
| 15 | F6 |  | 200/100 |
| 16 | F7 |  | 300/100 |
| 17 | F8 |  | 300/100 |
| 18 | F9 |  | 400/100 |

All gave better results than a control lacking a FC additive, in terms of both sensitivity and resolution except for Element 11 which contained F2. This is a copolymer composed of fluorinated and non-fluorinated monomers in an approximate ratio of 3:7, and hence has a low fluorine content compared to the other compounds tested. Better results might be obtained at higher loadings. Elements 12 and 18 gave particularly good results.

EXAMPLE 6

This Example demonstrates the use of various FC additives in donor elements which also contain an IR absorber.

The magenta pigment dispersion of Example 3 (50 g) was micronised with a solution of IR Dye I (0.5 g) in ethanol (8 ml). To 5 g aliquots of this mixture was added 0.0625 g FC additive, giving a FC:pigment ratio of 1:4.8. and donor elements were coated as before. The dried coatings (40° C./3 min) showed OD 1.85 at 576 nm from the pigment, and variable OD at 830 nm from the dye. In the absence of FC additive it was 0.85, but was generally lower in the presence of FC due to spectrum shifts, band broadening etc. Samples of each element. were imaged on the vacuum drum test bed using either plain or VYNS-coated (Hitachi) paper as receptor, and the max. scan speed/minimum laser power consistent with 100% transfer determined.

| Element | OD (830 nm) | F | Plain Paper Scan Speed/ Laser Power (cm/sec)/(mW) | VYNS-Coated Scan Speed/ Laser Power (cm/sec/(mW) |
|---|---|---|---|---|
| 19 | 0.85 | F1 | 400/100 | 200/100 |
| 20 | 0.82 | F2 | 200/100 | 500/100 |
| 21 | 0.75 | F3 | 400/100 | 200/100 |
| 22 | 0.65 | F4 | 200/100 | 500/75 |
| 23 | 0.81 | F5 | 400/100 | 300/100 |
| 24 | 0.80 | F6 | 300/100 | 500/75 |
| 25 | 0.79 | F7 | 300/100 | 500/100 |
| 26 | 0.75 | F8 | 300/100 | 500/100 |
| 27 | 0.35 | F9 | 200/100 | 400/100 |
| 28 | 0.85 | NONE | 100/100 | 200/100 |

Elements 19 to 27 all showed excellent resolution and improved sensitivity compared to the control Element 28. Highest sensitivity was shown by Elements 22 and 24 in combination with the coated paper receptor (equivalent to 0.075Jcm$^{-2}$).

EXAMPLE 7

This Example illustrates the utility of donor elements of the invention when imaged by a higher powered laser emitting at longer wavelengths. The magenta pigment dispersion of Example 3 (5.0 g) was micronised with ethanol (2.5 g) and Cyasorb IR-165 (0.2G) (an IR-absorbing dye available from American Cyanamid) for one hour. To the resulting mixture was added fluorocarbon F6 (0.105 g) and the mixture coated on polyester base (K-bar 2) and air dried. The resulting coating had OD 1.4 at 570 nm and 1.0 at 1053 nm. The FC:pigment ratio was 1:2.9.

A sample measuring 5 cm×5 cm was held in contact with VYNS-coated paper under vacuum and imaged via a Nd:YLF laser. The latter was a 1W diode-pumped Nd:YLF laser (model LDP-1000-3 from Laser Diode Inc.) emitting at 1053 nm. Its beam was scanned over a focussing lens using a linear galvanometer scanner (G325DT, General Scanning Inc.). Linear scan speeds of several thousand cm/sec were achieved by placing the galvanometer 80 cm away from the focussing lens and applying a low pass filtered square wave to the galvanometer. The beam power on the film was 700 mW and the spot size was 16×18 microns (full width at half maximum). Clean transfer was observed for scan speeds of up to 13000 cm/sec, corresponding to a sensitivity of approximately 0.03 joules/cm$^{-2}$. Scanning electron microscope analysis of the transferred image at 1575× magnification revealed a high quality image with excellent edge definition.

EXAMPLE 8

This Example demonstrates full colour imaging with YAG laser address. In the following formulations, the magenta chips comprised magenta pigment and Butvar B76 binder in the weight ratio 3:2, prepared as described in Example 2 but substituting Butvar B76 (polyvinylbutyral, supplied by Monsanto) for VAGH. The yellow and cyan chips comprised pigment and VAGH binder in the ratio 3:2 as described in Example 2.

The following millbases were prepared:

| Magenta | |
|---|---|
| Magenta chips | 1 g |
| 2-butanone | 10 g |
| Yellow | |
| Yellow chips | 1.5 g |
| 2-butatone | 36 g |
| Cyan | |
| Cyan chips | 1.5 g |
| 2-butanone | 28 g |

Magenta, yellow and cyan donor sheets were prepared by coating the following-formulations (A)–(C) respectively, on unsubbed polyester (K-Bar 2). In each case, the FC was added last, after micronising the other ingredients for 20 minutes.

| | | |
|---|---|---|
| (A) | Magenta millbase | 6.1 g |
| | 2-butanone | 2.4 g |
| | Ethanol | 0.5 g |
| | Cyasorb IR165 | 0.25 g |
| | F6 | 0.0625 g |
| (FC:pigment ratio 1:5.3) | | |
| (B) | Yellow millbase | 12.0 g |
| | Ethanol | 0.5 g |
| | Cyasorb IR165 | 0.3 g |
| | F6 | 0.0625 g |
| (FC:pigment ratio 1:4.6) | | |
| (C) | Cyan millbase | 9.5 g |
| | Ethanol | 0.5 g |
| | Cyasorb IR165 | 0.2 g |
| | FC | 0.0625 G |
| (FC:pigment ratio 1:4.6) | | |

A sample of the magenta donor was assembled in contact with a clay-coated paper receptor and mounted on an internal drum scanner with vacuum hold-down. The assembly was imaged through the polyester substrate in accordance with digitally-stored magenta halftone separation information using a YAG laser emitting at 1064nm. The laser delivered 2W at the image plane and was focussed to a 20 micron spot which was scanned at 64000 cm/sec. The process was repeated using the cyan and yellow donors in turn, so that three monochrome halftone separations were transferred to the same receptor. Examination of the resulting image showed good quality dots with no overprinting problems.

The experiment was repeated with the loading of F6 in each donor reduced by a factor of 2.5. In this case, the dot quality of the final image was poorer, with evidence of scattering of the toner particles.

EXAMPLE 9

A millbase was prepared from magenta chips (as in Example 3) (4.0 g) and 2-butanone (32.0 g).

Millbase (11.0 g) was combined with ethanol (2.0 g), 2-butanone (4.0 g).and IR Dye 2 (0.25 g) and mixed thoroughly (McCrone micronising mill) before adding fluorocarbon F6 (0.5 g) to give a FC:pigment ratio of 1:14.7. The resulting dispersion was coated and tested as described in Example 4 using VYNS-coated paper as receptor. High quality dot transfer was obtained, showing that lower levels of incorporation of FC are effective with laser diode address.

Structure of ir dye 2:

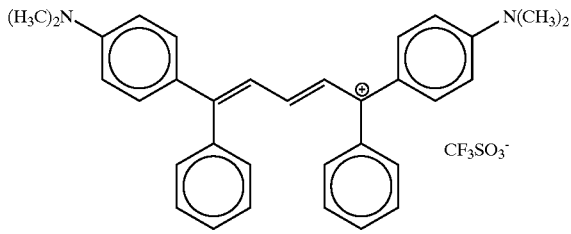

The words "Butvar", "Cyasorb", "Matchprint" "Fluorad", "Resinox" and "Vagh" are trade marks.

What is claimed is:

1. A thermal mass transfer donor element comprising a substrate having a surface colorant layer containing at least one pigment to be imagewise transferred, wherein said colorant layer comprises a fluorocarbon additive in an amount to provide a fluorocarbon additive:total pigment weight ratio from 1:20 to 1:1 and the pigment loading is in the range of 35 to 65 weight %.

2. A mass transfer imaging element according to claim 1 wherein said fluorocarbon additive:total pigment weight ratio from 1:15 to 1:1.

3. A mass transfer element according to claim 1 or claim 2 wherein said fluorocarbon additive is selected from:
   (i) compounds comprising a fluoroaliphatic group attached to a polar group or polar moiety and
   (ii) fluoropolymers having a molecular weight of at least 750 and comprising a non-fluorinated polymeric backbone having a plurality of pendant fluoroaliphatic groups, which aliphatic groups comprise the higher of (a) a minimum of three C—F bonds, or
   (b) in which 25% of the C—H bonds have been replaced by C—F bonds such that the fluorochemical comprises at least 15% by weight of Fluorine.

4. A mass transfer imaging element according to claim 1 wherein said element is a thermal mass transfer element and said fluorocarbon additive:total pigment weight ratio is in the range of 1.15 to 1:3.

5. A mass transfer imaging element according to claim 1 wherein said element additionally comprises an IR absorber in said colorant layer or in an underlayer thereto.

6. A mass transfer imaging element comprising a substrate having a surface colorant layer containing at least one pigment to be imagewise transferred, wherein said colorant layer comprises a fluorocarbon additive in an amount to provide a fluorocarbon additive:total pigment weight ratio of at least 1:20 wherein the element is a peel-apart development element.

7. A mass transfer imaging element according to claim 6 wherein said colorant layer additionally comprises a photopolymerizable material.

8. A mass transfer imaging element according to claim 7 wherein said fluorocarbon additive:total pigment weight ratio is in the range of 1:2 to 1:5.

9. A mass transfer imaging element according to claim 7 which comprises a substrate having a surface bearing a layer of pigmented photopolymerisable material overcoated with a barrier layer and outer layer of an adhesive.

10. A mass transfer imaging element according to claim 9 wherein said barrier layer comprises poly(vinyl alcohol).

11. The mass transfer imaging element of claim 1 wherein said fluorocarbon additive:total pigment weight ratio is from 1:10 to 1:1.

* * * * *